(12) United States Patent
Hunt

(10) Patent No.: US 6,606,271 B2
(45) Date of Patent: Aug. 12, 2003

(54) CIRCUIT HAVING A CONTROLLABLE SLEW RATE

(75) Inventor: Ken S. Hunt, Finchampstead (GB)

(73) Assignee: Mircron Technology, Inc., Boise, ID (US)

( * ) Notice: Subject to any disclaimer, the term of this patent is extended or adjusted under 35 U.S.C. 154(b) by 0 days.

(21) Appl. No.: 09/864,061

(22) Filed: May 23, 2001

(65) Prior Publication Data

US 2002/0176285 A1 Nov. 28, 2002

(51) Int. Cl.$^7$ .................................................. G11C 7/00
(52) U.S. Cl. ....................... 365/189.05; 326/83; 326/86; 326/88
(58) Field of Search .............................. 326/83, 86, 88, 326/26, 27; 365/189.05, 189.08, 198

(56) References Cited

U.S. PATENT DOCUMENTS

| | | | |
|---|---|---|---|
| 5,296,766 A | | 3/1994 | Masaki |
| 5,355,029 A | | 10/1994 | Houghton et al. |
| 5,426,333 A | * | 6/1995 | Maeda ........................ 327/536 |
| 5,479,132 A | * | 12/1995 | Verhaeghe et al. ......... 327/553 |
| 5,587,951 A | | 12/1996 | Jazayeri et al. |
| 5,619,147 A | | 4/1997 | Hunley |
| 5,698,991 A | | 12/1997 | Kamiya |
| 5,808,481 A | * | 9/1998 | Thompson ..................... 326/30 |
| 5,838,191 A | | 11/1998 | Opris et al. |
| 5,842,155 A | | 11/1998 | Bryson et al. |
| 5,877,634 A | | 3/1999 | Hunley |
| 5,949,259 A | * | 9/1999 | Garcia ........................... 326/26 |
| 5,973,512 A | * | 10/1999 | Baker ........................... 326/17 |
| 6,163,169 A | | 12/2000 | Lawson |
| 6,172,522 B1 | | 1/2001 | Kerr et al. |
| 6,236,239 B1 | | 5/2001 | Kogushi |
| 6,351,138 B1 | * | 2/2002 | Wong ........................... 326/30 |

* cited by examiner

Primary Examiner—Van Thu Nguyen
(74) Attorney, Agent, or Firm—Thorp Reed & Armstrong LLP

(57) ABSTRACT

A circuit for producing an output signal at an output thereof in response to an input signal at an input thereof is comprised, in one embodiment, of a first switch for connecting the output to a first voltage source and a second switch for connecting the output to a second voltage source. A first control switch is provided for turning off the first switch in response to the logic level of the input signal while a second control switch is provided for turning off the second switch in response to the logic level of the input signal. An integrator is responsive to the input signal for turning on one of the first and second switches depending on the logic level of the input signal. A method of operating such a circuit is also disclosed.

30 Claims, 4 Drawing Sheets

CIRCUIT HAVING A CONTROLLABLE SLEW RATE

BACKGROUND OF THE INVENTION

1. Field of the Invention

The present invention is directed to integrated circuits and, more particularly, to output or interface circuits driving output signals in which the slew rate must be controlled to meet customer or industry specifications.

2. Description of the Background

There are many types of output circuits. One type of output circuit, drive circuits, or drivers as they are commonly called, are used in a variety of applications. Typically, the driver acts as an interface between a logic circuit or other circuitry where signals are being manipulated at very low levels and circuits or loads which require high signal levels or large current levels. For example, drivers are found in various types of memory devices as the interface between the internals of the memory device and the external circuitry—microprocessor, etc. In such an environment, the driver is typically used to drive the data pad to a first voltage to represent a logic level 1 and a second voltage to represent a logic level 0. The driver typically must source sufficient current to enable signals available at the data pads to travel significant lengths along buses or to be sensed by other types of loads.

Prior art drive circuits typically utilize a pair of output drive transistors designed to operate in a complementary fashion. For example, the data pad may be connected to the first voltage through an n-type transistor and connected to the second voltage through a p-type transistor. When one of the transistors is on, the other transistor is off. In modem circuits, both transistors may be off to allow the data pad to receive data.

When designing drivers, it is necessary to insure that the transistors turn off as quickly as possible so as to avoid the situation where both transistors are on. If both transistors are on simultaneously, power will be wasted by current flowing through both transistors to ground or a negative voltage source. Such currents are referred to as "crowbar currents". Also, because of high operating speeds, it is necessary for the transistors to rapidly change state.

The rate at which an output transistor, the output of an amplifier, or the output of a circuit follows a change in state of an input signal is referred to as the slew rate. As illustrated in FIG. 1, if a step pulse is input to, for example, an amplifier, then the output should ideally be a step pulse as illustrated by the dotted line in FIG. 1. However, there is some finite rise time associated with the output signal, and that rise time or response rate is referred to as the slew rate. The slew rate is the slope of the line and is thus represented by voltage over time.

Another phenomenon that occurs that prevents the output signal from being a perfect step pulse occurs as the result of the output signal overshooting the final voltage value. After overshooting the final voltage value, the output signal approaches the final voltage either exponentially or with some damped ringing. The settling time is defined as the time between the edge of the applied step function and the point where the circuit output settles to within some stated percentage of the target voltage value. Slew rate and settling time present the circuit designer with competing design criteria. For example, a fast slew rate may actually increase settling time because a fast slew rate may result in a substantial overshooting of the desired final voltage value. Therefore, there is often a tradeoff between slew rate and settling time. In many applications, industry or individual consumers will set values for slew rate, settling time, as well as other parameters.

U.S. Pat. No. 5,838,191 entitled Bias Circuit for Switched Capacitor Applications ("the '191 patent") illustrates an example of a circuit that compensates for temperature and process variations by maintaining a constant settling time of CMOS operational amplifiers. An adaptive bias circuit allows a dynamic tradeoff between the slew rate and the gain bandwidth product which allows the output of the operational amplifier to settle within a certain predetermined precision. The '191 patent discloses a current source providing the same current to a pair of transistors having different effective current densities. A resistor is coupled between the pair of transistors while from one end of the resistor, a constant bias current is drawn. In that manner, the voltage difference across the resistor effectively indicates the change in the transconductance of the pair of transistors with respect to temperature and process variations.

U.S. Pat. No. 5,619,147, entitled CMOS Buffer with Controlled Slew Rate and U.S. Pat. No. 5,877,643 entitled CMOS Buffer with Controlled Slew Rate disclose a method and apparatus for a CMOS buffer circuit having a controlled slew rate at the output using no additional standby power to achieve the slew rate. A feedback path from the output is coupled to transistors comprising a differential pair. The transistors are further coupled to a capacitance. The charge rate of the capacitance and the size choices of the transistors are used with the feedback path to control the high-to-low and low-to-high transition rate of the output.

U.S. Pat. No. 6,163,169 is entitled CMOS Tri-State Control Circuit for a Bidirectional I/O with Slew Rate Control (the '169 patent). The '169 patent discloses a digital circuit which pulls up an output node using an NFET device. The digital circuit is part of a CMOS pre-driver having balanced delays for coming out of a tri-state mode and for data mode operation.

U.S. Pat. No. 6,172,522 is entitled Slew Rate Controlled Pre-driver Circuit (the '522 patent). In the '522 patent, a digital CMOS pre-driver circuit pulls an output node up and down with accurately controlled rise and fall times in the threshold region. Resistors independently set rise and fall slew rates while additional CMOS devices initially charge and discharge an output node. The additional devices turn off before the output reaches the threshold region.

U.S. Pat. No. 5,296,766 is entitled CMOS Circuit with Crow bar Limiting Function (the '766 patent). The '766 patent discloses a CMOS amplifier circuit in which crow bar current is limited during a transition state where one transistor is being turned on and another transistor is being turned off.

Despite a number of circuits directed to this problem, the need still exists for an output or interface circuit having an adjustable slew rate, while minimizing or eliminating crow bar currents, and implemented with a minimal parts count.

SUMMARY OF THE PRESENT INVENTION

The present invention is directed to a circuit for producing an output signal at an output thereof in response to an input signal at an input thereof. The circuit may be embodied, for example, in a driver circuit. The present invention, in one embodiment, is comprised of a first switch for connecting the output to a first voltage source and a second switch for connecting the output to a second voltage source. A first control switch is provided for turning off the first switch in response to the logic level of the input signal while a second control switch is provided for turning off the second switch in response to the logic level of the input signal. An integrator is responsive to the input signal for turning on one of the first and second switches depending on the logic level of the input signal.

The present invention is also directed to a method of operating an output circuit of the type having first and second switches connecting first and second voltage sources, respectively, to an output in response to the logic levels of an input signal. The method is comprised of the steps of:

turning off the one of the first and second switches which is on in response to a change in logic level of the input signal;

integrating the input signal; and turning on the one of the first and second switches which was previously off in response to the integrated input signal.

The present invention, when implemented in CMOS circuitry, provides a simple circuit with minimal component count, while still providing slew rate control. By insuring that the transistors connecting the output to voltage sources are turned off quickly, and turned on more slowly than they are turned off, crowbar currents are reduced or eliminated.

Other embodiments of the invention contemplate the integrator being comprised of a variable or programmable current source used to charge a capacitor comprising part of the integrator. In that manner, more control over the slew rate is provided. When the present invention is implemented in conjunction with a memory device, the various transistors and capacitors can be fabricated along with the components comprising a memory device. Those, and other advantages and benefits, will be apparent from the Description of the Preferred Embodiment appearing hereinbelow.

BRIEF DESCRIPTION OF THE DRAWINGS

For the present invention to be easily understood and readily practiced, the present invention will now be described, for purposes of illustration and not limitation, in conjunction with the following figures, wherein.

DESCRIPTION OF THE PREFERRED EMBODIMENTS

Figure 2:
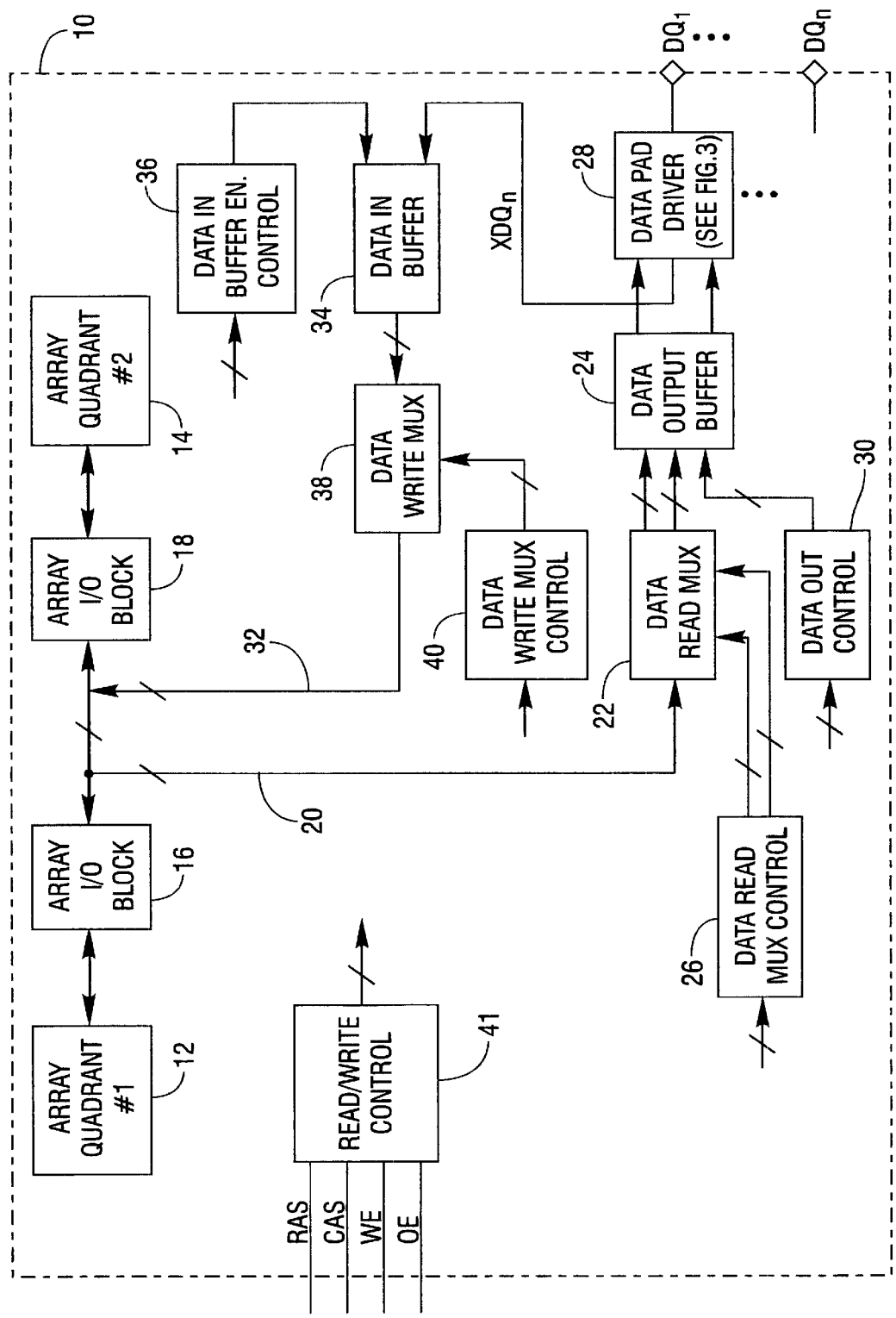
FIG. 2 is a block diagram of a memory circuit in which a driver constructed according to the teachings of the present invention may be used.

FIG. 2 illustrates a memory device 10 in which the output circuit of the present invention may be used. The reader should recognize that the output circuit of the present invention may be used in a number of devices other than the memory device 10 illustrated in FIG. 2. The memory device 10 illustrated in FIG. 2 is thus presented for purposes of illustration to provide a concrete example of where the present invention may be utilized. The reader should also recognize that the memory device 10 illustrated in FIG. 2 has been greatly simplified. Those of ordinary skill in the art will recognize that a number of other components are necessary to produce an operative memory device 10. However, as such other components serve no purpose with respect to the understanding of the present invention, such components have been eliminated for purposes of clarity.

In the memory device 10 of FIG. 2, a plurality of individual memory cells are arranged in an array which is divided into a first array quadrant 12 and a second array quadrant 14. Array quadrant 12 is serviced by an array I/O block 16 while array quadrant 14 is serviced by an array I/O block 18. The array I/O blocks 16 and 18 place data read from the memory array on a data read path 20. The first element of the data read path 20 is a data read mux 22. The data read mux 22 determines the data to be input to an output data buffer 24 in response to control signals produced by a data read mux control circuit 26. The data output buffer 24 outputs the data to a data pad driver 28 in response to a data out control circuit 30. The data pad driver 28 drives a data pad DQ1 to either a first or a second voltage, e.g. Vccq or Vssq, to represent a logic level "1" or a logic level "0", respectively, on the pad DQ1. The reader will recognize that a typical memory device 10 will have a plurality of data pad drivers 28 servicing data pads DQ1 through DQn. The data pad driver 28 forms an important part of the present invention and will be described in greater detail hereinbelow in conjunction with FIG. 3.

Completing the description of the memory device 10 illustrated in FIG. 2, a write data path 32 is provided. The write data path 32 includes a data in buffer 34 which is under the control of a data in buffer enable control circuit 36. Data from the data in buffer 34 is input to a data write mux 38 which is under the control of a data write mux control circuit 40. From the data write mux 38, data is input to the array I/O blocks 16, 18 and ultimately written into array quadrants 12, 14, respectively, according to address information received by memory device 10. A read/write control circuit 41 is responsive to control signals such as, for example, RAS, CAS, WE, and OE, to produce the various signals needed for proper operation of the data read mux control 26, data out control 30, data in buffer enable control 36, and data write mux control 40. The array I/O blocks 16, 18 together with the data read path 20, write data path 32, and read/write control 41 comprise peripheral circuits for moving information between the array quadrants 12, 14 and the data pads DQ1–DQn.

Figure 3:
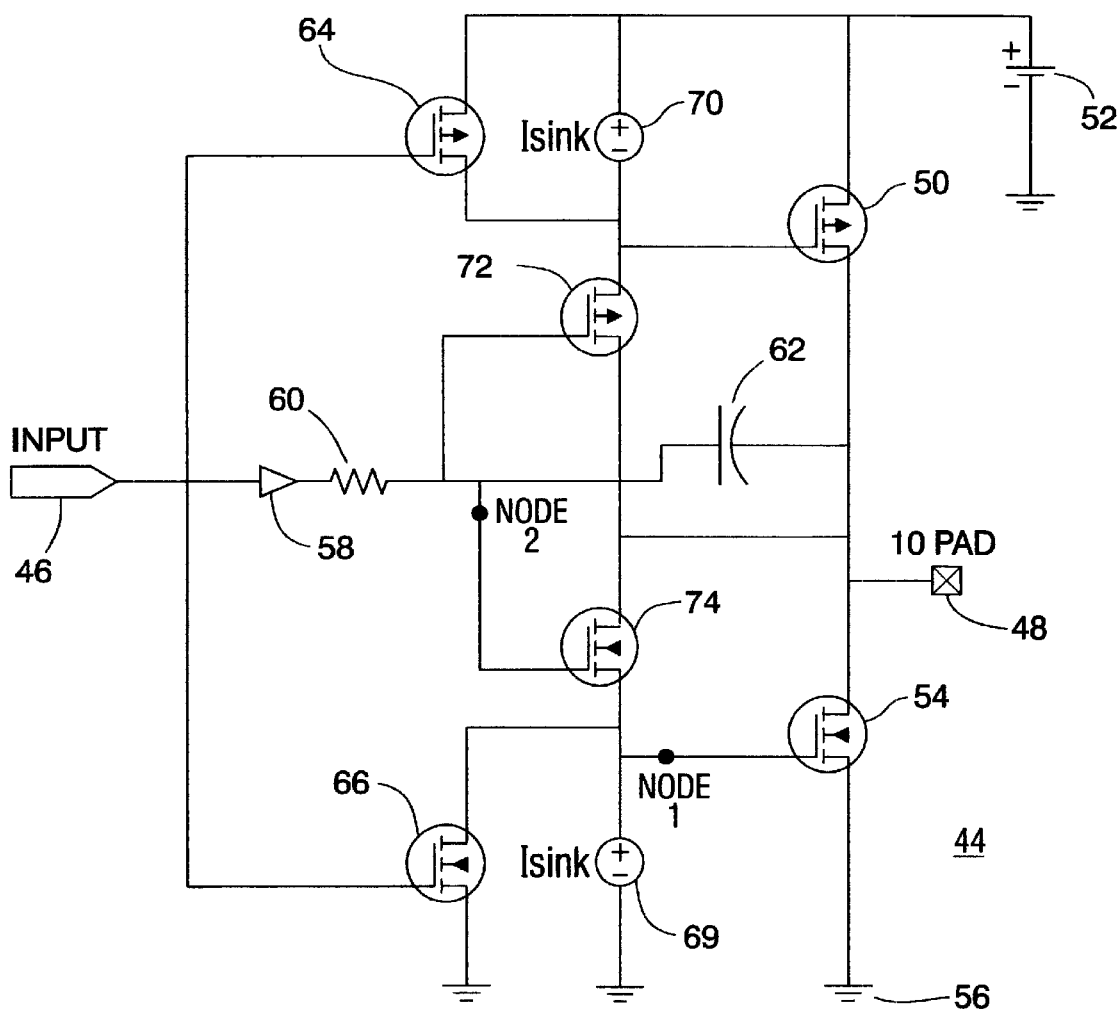
FIG. 3 is an electrical schematic of the driver of FIG. 2.

In FIG. 3, an output circuit 44 constructed according to the teachings of the present invention is illustrated. The output circuit 44 may perform the function of the data pad driver 28 illustrated in FIG. 2. In FIG. 3, the circuit 44 has an input pin 46 and an input/output pad 48. The output pad 48 is connected through a first switch 50 to a first voltage source 52. The first switch 50 may take the form of a p-type transistor. The pad 48 is also connected through a second switch 54 to a second voltage source 56, which in this case is ground. The second switch 54 may take the form of an n-type transistor. The first voltage source 52 and the second voltage source 56 are typically representative of first and second logic levels, respectively.

An inverter 58 is responsive to the input pin 46. The inverter 58 is connected to the output pad 48 through the series combination of a resistor 60 and a capacitor 62. The inverter 58, resistor 60, capacitor 62 form an integrator which integrates an input signal available at input pin 46.

The circuit 44 also includes a first control switch 64 which may be implemented by a p-type transistor. The transistor 64 has a drain terminal connected to a control terminal of the transistor 50, a source terminal connected to the voltage source 52, and a control terminal connected to the input pin 46. A second control switch 66 is provided which may be implemented by an n-type transistor. The transistor 66 has a drain terminal connected to the control terminal of the transistor 54, a source terminal connected to ground, and a control terminal connected to the input pin 46. The control terminal of the transistor 54 is additionally connected to ground through a current sink 69 while the control terminal of the transistor 50 is connected to the first voltage source 52 through a current sink 70. The first control switch 64 is responsive to the input signal for turning off the first switch 50 while the second control switch 66 is responsive to the input signal for turning off the second switch 54 as will be described more fully hereinbelow.

Completing the description of FIG. 3, a source follower 72 which may take the form of a p-type transistor has a drain terminal connected to the control terminal of the transistor 50, a source terminal connected to the pad 48, and a control terminal connected to the junction between the resistor 60 and capacitor 62. A source follower 74 which may take the form of an n-type transistor has a source terminal connected to the control terminal of the transistor 54, a drain terminal connected to the pad 48, and a control terminal connected to the junction between the resistor 60 and the capacitor 62. The source followers 72 and 74 are used to switch on the transistors 50 and 54, respectively, as discussed more fully below.

The circuit 44 disclosed herein works on the basis of a simple RC integrator circuit. By eliminating the traditional operational amplifier based integrator and replacing it with the inverter, CMOS pair component count is considerably reduced. For CMOS I/O circuitry, linearity (and hence the need for high gain operational amplifiers) is not needed. However, where large strength drive is required the output devices need to be controlled to prevent crowbar currents.

If we assume that a low to high transition has been received at the input pin 46, the transistor 66 switches on discharging the control terminal of transistor 54 and thereby disabling any crowbar current through the output pair of transistors 50, 54. In addition, the output of the inverter 58 changes state from high to low which begins to discharge node 2 through resistor 60. As the potential of node 2 falls, transistor 72 starts to conduct and discharges the gate of transistor 50. The gate of transistor 50 reaches a point where transistor 50 begins to conduct thereby connecting first voltage source 52 to the pad 48. Pad 48 assumes a voltage potential equal to that of first voltage source 52 less the voltage drop across transistor 50. That lifts the potential of one of the plates of the capacitor 62 thereby providing negative feedback to node 2. Consequently, the maximum slew rate at the output 48 becomes a product of the resistor 60 and the capacitor 62. By controlling the values of those components, the slew rate can be controlled.

The operation of the circuit 44 may be summarize as follows:

turning off one of the first 50 and second 54 switches, whichever is on, in response to a change in the logic level of the input signal;

integrating the input signal; and turning on one of the first 50 and second 54 switches, whichever one was previously off, in response to the integrated input signal.

By controlling the off times with the input signal and the on times with the integrated input signal, the off times are more abrupt and occur more quickly than the on times. By insuring that the transistor which is on is turned off before turning the next transistor on, crowbar currents are minimized or eliminated.

Figure 4:
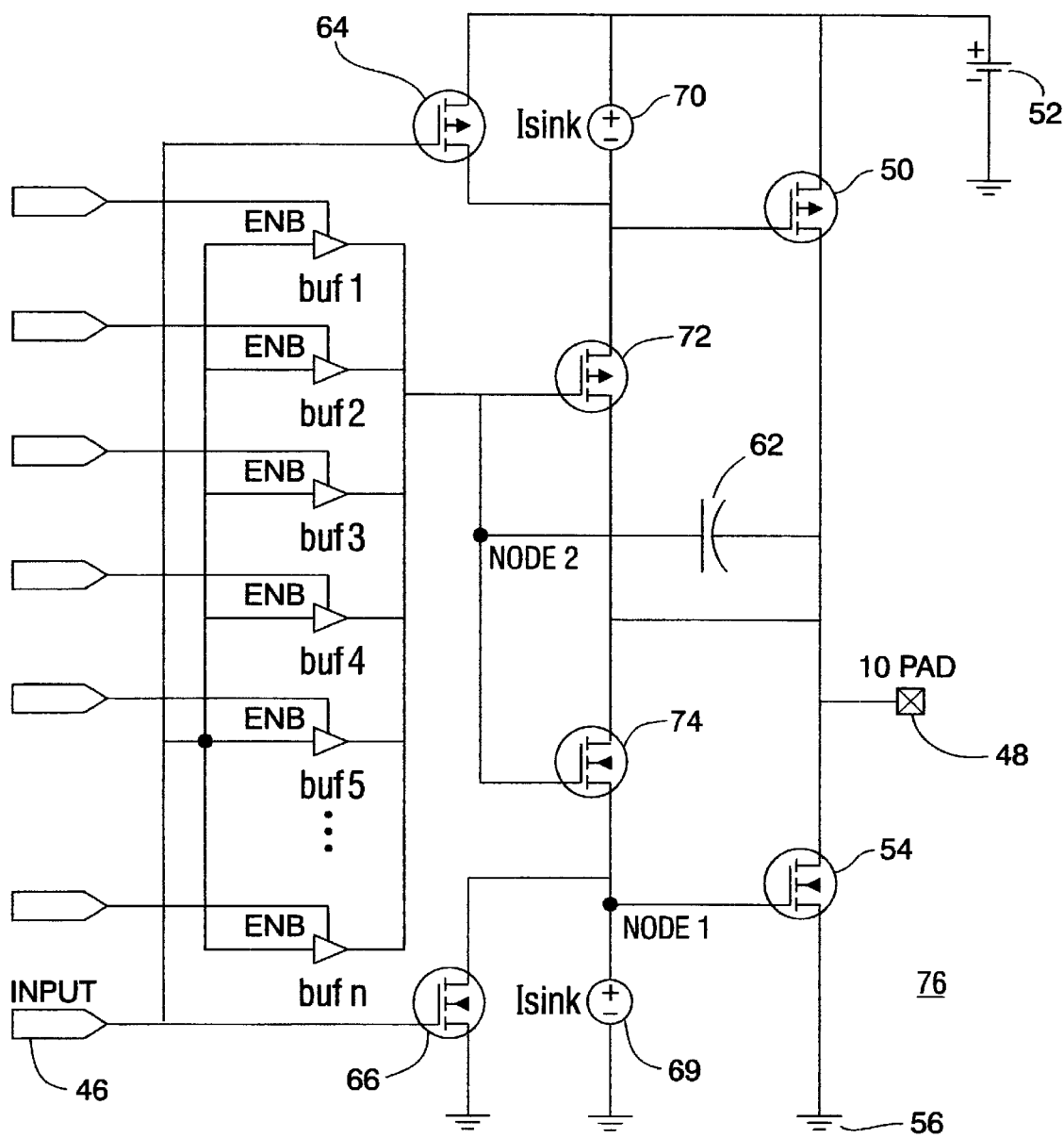
FIG. 4 is an electrical schematic of another embodiment of a driver constructed according to the teachings of the present invention.

An alternative embodiment of the present invention is illustrated in FIG. 4. Where appropriate, the same reference numerals are used in FIG. 4 as those used in FIG. 3. The embodiment of FIG. 4 is fundamentally the same as the embodiment of FIG. 3 but provides the user with additional control over the slew rate. The output circuit 76 illustrated in FIG. 4 is substantially the same as the circuit 44 illustrated in FIG. 3 except that inverter 58 and resistor 60 have been replaced with a series of buffers, buf1 through bufn. The buffers buf1 through bufn represent a circuit providing a variable drive to the node 2 depending upon how many of the buffers are enabled. A feedback/control loop may be constructed to control the enable signal lines to give a pre-defined and controllable slew rate at the output. Alternatively, the buffers buf1 through bufn could be replaced with an analog circuit having a variable drive capability. Those of ordinary skill in the art will recognize that such an analog device is equivalent to the programmable device illustrated in FIG. 4.

The present invention provides a simple circuit with minimal component count which enables the slew rate to be controlled in a manner particularly suited for CMOS circuitry. As discussed, the sequence of operation is such that crowbar currents are reduced or eliminated. Additionally, the embodiment of FIG. 4 enables the slew rate to be programmed so as to meet industry or customer specifications.

Figure 1:
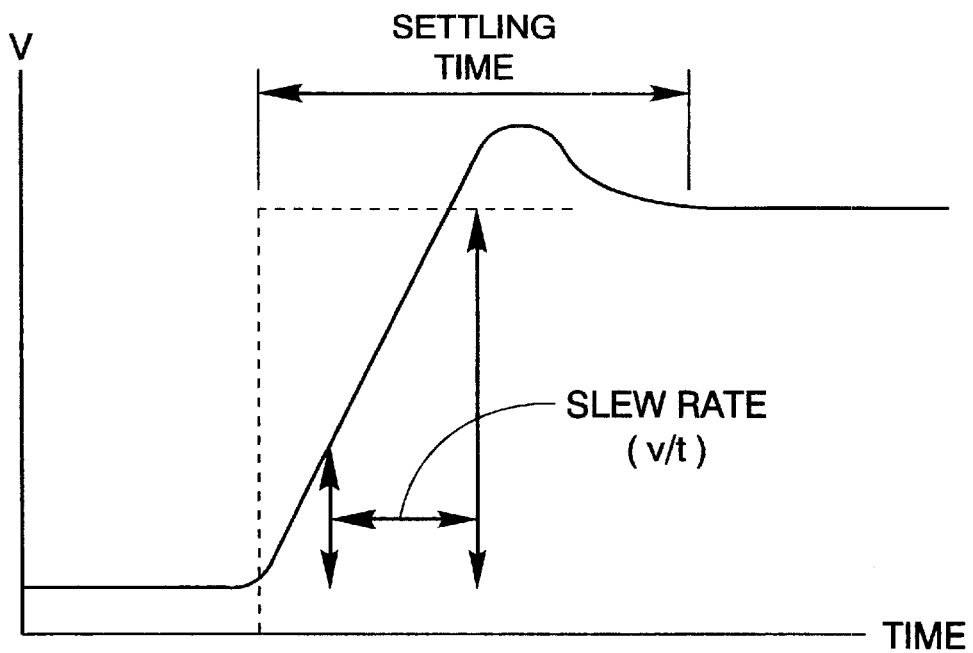
FIG. 1 is graph illustrating slew rate, overshoot, and settling time of an output circuit.
Figure 5:
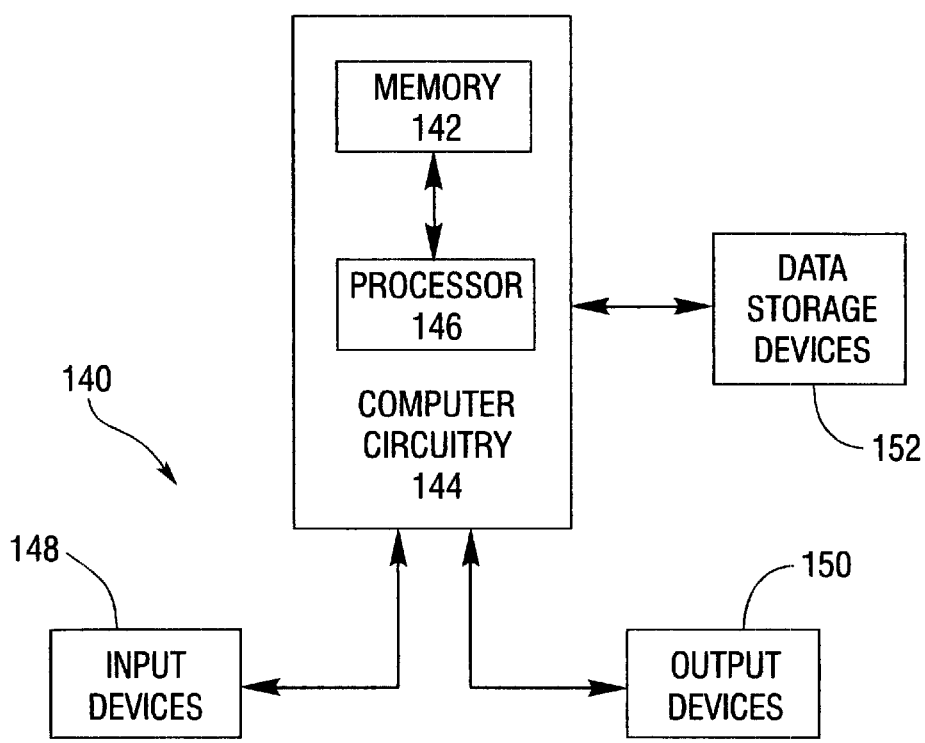
FIG. 5 is a block diagram of a system incorporating the memory device of FIG. 1.

FIG. 5 is a block diagram of an electronic system 140, such as a computer system, that incorporates a memory device 142 of a type which may include the circuit of the present invention. The system 140 includes computer circuitry 144 for performing computer functions, such as executing software to perform desired calculations and tasks. The circuitry 144 typically includes a processor 146 and the memory device 142, which is coupled to the processor 146. One or more input devices 148, such as a keyboard or mouse, are coupled to the computer circuitry 144 and allow an operator (not shown) to manually input data thereto. One or more output devices 150 are coupled to the computer circuitry 144 to provide to the operator data generated by the computer circuitry 144. Examples of such output devices 150 include a printer and a video display unit. One or more data-storage devices 152 are coupled to the computer circuitry 144 to store data on or retrieve data from external storage media (not shown). Examples of the storage devices 152 and the corresponding storage media include drives that accept hard and floppy disks, tape cassettes, and compact disk read-only memories (CD-ROMs). Typically, the computer circuitry 144 includes address, data, and command buses and a clock line that are respectively coupled to the address, data and command buses and the clock line of the memory device 142.

While the present invention has been described in connection with exemplary embodiments thereof, those of ordinary skill in the art will recognize that many modifications and variations are possible. Such modifications and variations are intended to be within the scope of the present invention, which is limited only by the following claims.

What is claimed is:

1. A circuit for producing an output signal at an output thereof in response to an input signal at an input thereof, comprising:

a first switch for connecting the output to a first voltage source;

a second switch for connecting the output to a second voltage source;

an RC integrator, responsive to the input signal, for turning said first and second switches on;

a first control switch, responsive to the input signal, for turning off the first switch; and a second control switch, responsive to the input signal, for turning off the second switch.

2. The circuit of claim 1 wherein said RC integrator comprises an inverter responsive to the input signal, and a resistor and a capacitor connected in series between said inverter and the output.

3. The circuit of claim 1 wherein said RC integrator comprises a variable drive circuit and a capacitor connected in series between the input and the output.

4. The circuit of claim 2 or 3 wherein said first switch is one of an n-type transistor and a p-type transistor, and wherein said second switch is one of an n-type transistor and a p-type transistor, said circuit additionally comprising a source follower comprising a transistor having one terminal connected to a control terminal of said first switch, a second terminal connected to the output, and a control terminal connected to said capacitor, said circuit additionally comprising a second source follower comprising a transistor having one terminal connected to a control terminal of said second switch, a second terminal connected to the output, and a control terminal connected to said capacitor.

5. The circuit of claim 3 wherein said variable drive circuit includes a circuit having a programmable output current.

6. A drive circuit, comprising:
an input for receiving an input signal having at least first and a second logic levels;
an output pad;
a first switch for connecting said output pad to a first voltage source representative of the first logic level;
a second switch for connecting said output pad to a second voltage source representative of the second logic level;
an RC integrator for turning on one of said first and second switches in response to the logic level of the input signal; and
first and second control switches for turning off one of said first and second switches, respectively, in response to the logic level of the input signal.

7. The drive circuit of claim 6 wherein said RC integrator comprises an inverter responsive to the input signal, and a resistor and a capacitor connected in series between said inverter and said output pad.

8. The drive circuit of claim 7 wherein said RC integrator comprises a variable drive circuit and a capacitor connected in series between said input and said output pad.

9. The drive circuit of claim 7 or 8 wherein said first switch is one of an n-type transistor and a p-type transistor, and wherein said second switch is one of an n-type transistor and a p-type transistor, said circuit additionally comprising a source follower comprising a transistor having one terminal connected to a control terminal of said first switch, a second terminal connected to said output pad, and a control terminal connected to said capacitor, said circuit additionally comprising a second source follower comprising a transistor having one terminal connected to a control terminal of said second switch, a second terminal connected to said output pad, and a control terminal connected to said capacitor.

10. The drive circuit of claim 8 wherein said variable drive circuit includes a circuit having a programmable output current.

11. A memory device, comprising:
an array of memory cells;
a plurality of pads; and
circuitry for moving information between said array of memory cells and said plurality of data pads, said circuitry including a plurality of drivers each servicing one of said data pads, each driver comprising:
an input for receiving an input signal having at least first and a second logic levels;
a first switch for connecting one of said output pads to a first voltage source representative of the first logic level;
a second switch for connecting said output pad to a second voltage source representative of the second logic level;
an RC integrator for turning on one of said first and second switches in response to the logic level of the input signal; and
first and second control switches for turning off one of said first and second switches, respectively, in response to the logic level of the input signal.

12. The memory device of claim 11 wherein said RC integrator comprises an inverter responsive to the input signal, and a resistor and a capacitor connected in series between said inverter and said output pad.

13. The memory device of claim 11 wherein said RC integrator comprises a variable drive circuit and a capacitor connected in series between said input and said output pad.

14. The memory device of claim 12 or 13 wherein said first switch is one of an n-type transistor and a p-type transistor, and wherein said second switch is one of an n-type transistor and a p-type transistor, said driver additionally comprising a source follower comprising a transistor having one terminal connected to a control terminal of said first switch, a second terminal connected to said output pad, and a control terminal connected to said capacitor, said driver additionally comprising a second source follower comprising a transistor having one terminal connected to a control terminal of said second switch, a second terminal connected to said output pad, and a control terminal connected to said capacitor.

15. The memory device of claim 13 wherein said variable drive circuit includes a circuit having a programmable output current.

16. A system, comprising:
a processor;
a memory device connected to said processor, said memory device comprising:
an array of memory cells;
a plurality of pads; and
circuitry for moving information between said array of memory cells and said plurality of data pads, said circuitry including a plurality of drivers each servicing one of said data pads, each driver comprising:
an input for receiving an input signal having at least first and a second logic levels;
a first switch for connecting one of said output pads to a first voltage source representative of the first logic level;
a second switch for connecting said output pad to a second voltage source representative of the second logic level;
an RC integrator for turning on one of said first and second switches in response to the logic level of the input signal; and
first and second control switches for turning off one of said first and second switches, respectively, in response to the logic level of the input signal.

17. The system of claim 16 wherein said RC integrator comprises an inverter responsive to the input signal, and a resistor and a capacitor connected in series between said inverter and said output pad.

18. The system of claim 16 wherein said RC integrator comprises a variable drive circuit and a capacitor connected in series between said input and said output pad.

19. The system of claim 17 or 18 wherein said first switch is one of an n-type transistor and a p-type transistor, and wherein said second switch is one of an n-type transistor and a p-type transistor, said driver additionally comprising a source follower comprising a transistor having one terminal connected to a control terminal of said first switch, a second terminal connected to said output pad, and a control terminal connected to said capacitor, said driver additionally comprising a second source follower comprising a transistor having one terminal connected to a control terminal of said second switch, a second terminal connected to said output pad, and a control terminal connected to said capacitor.

20. The system of claim 18 wherein said variable drive circuit includes a circuit having a programmable output current.

21. A method of operating an output circuit of the type having first and second switches connecting first and second voltage sources, respectively, to an output in response to the logic levels of an input signal, said method comprising:

integrating the input signal with an RC integrator;

turning one of the first and second switches off in response to the input signal; and turning one of the first and second switches on in response to the integrated input signal.

22. The method of claim 21 wherein the step of turning the first and second switches off is carried out more quickly than the step of turning the first and second switches on.

23. The method of claim 21 wherein said step of turning one of the first and second switches on is carried out when both of the first and second switches are off.

24. The method of claim 21 wherein said step of integrating the input signal includes the step of charging a capacitor with a programmable current.

25. The method of claim 21 wherein said step of integrating the input signal includes the step of charging a capacitor with a variable current.

26. A method of operating an output circuit of the type having first and second switches connecting first and second voltage sources, respectively, to an output in response to the logic levels of an input signal, said method comprising:

turning off the one of the first and second switches which is on in response to a change in logic level of the input signal;

integrating the input signal with an RC integrator; and turning on the one of the first and second switches which was previously off in response to the integrated input signal.

27. The method of claim 26 wherein the step of turning off is carried out more quickly than the step of turning on.

28. The method of claim 26 wherein said step of turning on is carried out when both of the first and second switches are off.

29. The method of claim 26 wherein said step of integrating the input signal includes the step of charging a capacitor with a programmable current.

30. The method of claim 26 wherein said step of integrating the input signal includes the step of charging a capacitor with a variable current.

* * * * *

UNITED STATES PATENT AND TRADEMARK OFFICE
CERTIFICATE OF CORRECTION

PATENT NO.     : 6,606,271 B2
DATED          : August 12, 2003
INVENTOR(S)    : Ken S. Hunt It is certified that error appears in the above-identified patent and that said Letters Patent is hereby corrected as shown below:

<u>Title page,</u>
Item [73], Assignee, delete "Mircron" and insert therefor -- Micron --.

<u>Column 2,</u>
Line 49, delete "bar" and insert therefor -- Bar --.

<u>Column 5,</u>
Line 56, delete "summarize" and insert therefor -- summarized --.

Signed and Sealed this

Fourteenth Day of October, 2003

JAMES E. ROGAN
*Director of the United States Patent and Trademark Office*